US00RE36185E

United States Patent [19]

Remba et al.

[11] E Patent Number: Re. 36,185

[45] Reissued Date of Patent: Apr. 6, 1999

[54] METHOD OF FABRICATING GROUP III–V COMPOUND SEMICONDUCTOR DEVICES USING SELECTIVE ETCHING

[75] Inventors: Ronald E. Remba; Paul E. Brunemeier, both of Sunnyvale, Calif.; Bruce C. Schmukler, Greensboro, N.C.; Walter A. Strifler, Sunnyvale; Daniel H. Rosenblatt, San Carlos, both of Calif.

[73] Assignee: Watkins Johnson Company, Palo Alto, Calif.

[21] Appl. No.: 751,776

[22] Filed: Dec. 5, 1996

Related U.S. Patent Documents

Reissue of:

[64] Patent No.: 5,374,328
Issued: Dec. 20, 1994
Appl. No.: 37,074
Filed: Mar. 25, 1993

[51] Int. Cl.[6] ..... B44C 1/22

[52] U.S. Cl. ..... 438/604; 438/606

[58] Field of Search ..... 437/225, 228, 437/234, 58; 156/628.1, 662.1, 656.1; 252/79.1, 79.2, 79.4, 79.5; 438/604, 606

[56] References Cited

U.S. PATENT DOCUMENTS

| | | | |
|---|---|---|---|
| 4,486,536 | 12/1984 | Baker et al. | 436/66 |
| 4,835,101 | 5/1989 | Kao et al. | 435/28 |
| 4,914,488 | 4/1990 | Yamane et al. | 357/4 |
| 4,935,377 | 6/1990 | Strifler et al. . | |
| 5,041,393 | 8/1991 | Ahrens et al. . | |
| 5,110,765 | 5/1992 | Balakanti et al. . | |
| 5,215,885 | 6/1993 | Marrujo et al. | 435/794 |

FOREIGN PATENT DOCUMENTS

| | | | |
|---|---|---|---|
| 0 095 302 A1 | 11/1983 | European Pat. Off. | G01N 33/72 |
| 0 292 057 A1 | 11/1988 | European Pat. Off. | H01L 21/31 |
| 0323220 | 7/1989 | European Pat. Off. . | |
| 0 617 458 A2 | 9/1994 | European Pat. Off. | H01L 21/306 |
| 0 617 458 A3 | 9/1994 | European Pat. Off. | H01L 21/306 |

OTHER PUBLICATIONS

DeSalvo, Gregory C., et al., "Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP", *J. Electrochem. Soc.*, vol. 139, No. 3, Mar. 1992, pp. 831–835.

Tong, M., et al., "Process for Enhancement/Depletion–Mode GaAs/InGaAs/AlGaAs Pseudomorphic MODFETs Using Selective Wet Gate Recessing", *J. Electrochem. Soc.*, vol. 139, No. 3, Mar. 1992, pp. 1633–1634.

(List continued on next page.)

*Primary Examiner*—Jey Tsai
*Attorney, Agent, or Firm*—Flehr Hohbach Test Albritton & Herbert LLP

[57] ABSTRACT

A solution of hydrogen peroxide [$H_2O_2$], citric acid [$HOC(CH_2COOH)_2COOH.H_2O$], and a salt of citric acid such as potassium citrate [$HOC(CH_2COOK)_2COOK.H_2O$], and hydrogen peroxide [$H_2O_2$], in a proper pH range, selectively etches GaAs-containing Group III–V compounds in the presence of other Group III–V compounds. As an illustration, $Al_yGa_{1-y}As$ is selectively etched in the presence of $Al_xGa_{1-x}As$ ($0 \leqq y < 0.2$ & $x > 0.2$) when the pH range of the etchant solution is between approximately 3 and 6. The etchant solution described herein may be utilized in the fabrication of, for example, high-frequency transistors exhibiting improved saturated current ($I_{dss}$) and threshold voltage ($V_{th}$) uniformity.

11 Claims, 9 Drawing Sheets

OTHER PUBLICATIONS

Broekaert, Tom P.E., et al., "Novel, Organic Acid–Based Etchants for InGaAlAs/InP Heterostructure Devices with AlAs Etch–Stop Layers", *J. Electrochem. Soc.*, vol. 139, No. 3, Mar. 1992, pp. 2306–2309.

De Salvo, Tsens, Comas, "Etch rates and selectivities of Citricacid/hydrogen peroxide on GaAs, AlGaAs, InGaAs ($In_{0.2}Ga_{0.8}As$), ($In_{0.53}Ga_{0.47}As$); ($In_{0.52}Al_{0.48}As$) and Indium Phosphid". J. Electrochem, Soc., 139(3), 831–5. 76–3. (Electric Phenomena.).

"An edge–defined technique for fabricating submicron metal–semiconductor field effect transistor gates"; W.A. Strifler et al.; J. Vac. Sci. Technol. B8(6), Nov./Dec. 1990; pp. 1297–1299.

"Preferential etching of GaAs through photoresist masks"; M. Otsubo et al.; J. Electro. Chem Soc. 123,676 (1976); pp. 676–680.

"Use of thin AlGaAs and InGaAs stop–etch layers for reactive ion etch processing of III–V compound semiconductor devices"; C.B. Cooper III et al.; Appl. Phy. Let 51. (1987); pp. 2225–2226.

"Reactive ion etching damage to GaAs layers with etch stops"; C.M. Knoedler et al.; J. Vac. Sci. Technol B6, (1988); pp. 1573–1576.

"The role of aluminum in selective reactive ion etching of GaAs on AlGaAs[a)]"; K.L. Seaward et al.; J. Vac Sci. Tech. B6 (6), Nov./Dec. 1988; pp. 1645–1649.

"Selective reactive ion etching for short–gate–length GaAs/AlGaAs/InGaAs pseudomorphic modulation–doped field effect transistors"; A.A. Ketterson et al.; J. Vac.Sci. Tech. B7, (1989). pp. 1493–1496.

"GaAs/AlGaAs HEMTs with sub 0.5 micron gatelength written by E–beam and recessed by dry–etching for direct–coupled FET logic (DCFL)"; A. Hulsmann et al.; Proc. Int. Symp on GaAs and Related Compounds, Jersey (1990); pp. 429–434.

"Electron concentration and mobility loss in GaAs/GaAlAs heterostructures caused by reactive ion etching"; W. Beinstingl et al.; Appl. Phy. Lett 57, (1990); pp. 177–179.

"Selective etching of GaAs and AlGaAs"; C.M. Chang et al.; MRI Bull. Res. Dev. 4 (1990); pp. 95–99.

"Selective etching of GaAs and $Al_{0.30}Ga_{0.70}$ as with citric/acit/hydrogen peroxide solutions"; C. Juang et al.; J. Vac.Sci Tech B8 (1990); pp. 1122–1124.

"An edge–defined technique for fabricating submicron metal–semiconductor field effect transistor gates"; W.A. Strifler et al.; J. Vac.Sci. Tech B8 (1990); p. 1297.

"Damage studies of dry etched GaAs recessed gates for field effect transistors"; S. Saliman et al.; J.Vac.Sci. Tech B9 (1991); p. 114.

"A comparative study of wet and dry selective etching processes for GaAs/AlGaAs/InGaAs pseudomorphic MODFETs"; M. Tong et al.; J. Elec. Mat. 21 (1992); p. 9.

"AlAs etch–stop layers for InGaAlAs/InP heterostructure devices and circuits"; T.P.E. Broekaert et al.; IEEE Trans. Elec. Dev. 39, (1992); p. 533.

"Dry etch induced damage in GaAs investigated using Raman scattering spectroscopy"; D.G. Lishan et al.; J.Vac-.Sci.Tech B7(3), May/Jun. 1989; p. 556.

METHOD OF FABRICATING GROUP III–V COMPOUND SEMICONDUCTOR DEVICES USING SELECTIVE ETCHING

Matter enclosed in heavy brackets [ ] appears in the original patent but forms no part of this reissue specification; matter printed in italics indicates the additions made by reissue.

This invention relates generally to the fabrication of Group III–V compound semiconductor devices and, more particularly, to selective etching techniques used in such fabrication.

BACKGROUND OF THE INVENTION

Selective etching has been considered for use as a technique in the manufacture of various semiconductor devices such as field-effect transistors (FET's). This technique involves incorporating an "etch stop" layer into the device in order to prevent unintended etching of underlying structures. Such unintended etching leads to variations in the thickness in the active layers of FET's, which in turn results in undesired conductance variations of FET active channel regions. As an example, variation in the uniformity of the etched active layers associated with the MESFET devices on a single wafer has limited production of MESFET-based integrated circuits formed on layered semiconductor structures grown using molecular beam epitaxy (MBE) processing techniques.

A number of methods have been developed for improving the uniformity of devices realized upon MBE-grown semiconductor structures. Included among these methods are selective "dry" (e.g., plasma) etching, selective "wet" etching using chemical solutions, as well as nonselective spray gate recess etching. Selective etch stop systems have so far proven the most effective in enhancing device uniformity. One figure of merit used to characterize selective etching techniques is known as "etch selectivity", which is defined as the ratio of the etch rate of the semiconductor layer overlying the etch stop layer to the etch rate of the etch stop layer. Although dry etchants enable high etch selectivity, dry etchants tend to increase the risk of damage to semiconductor devices relative to wet etchants. On the other hand, the lower etch selectivity of wet etchants has often required the utilization of relatively thick etch stop layers to prevent inadvertent etching of underlying portions of the device. Unfortunately, such thick etch stop layers often degrade device performance relative to otherwise identical devices fabricated in the absence of an etch stop layer. For example, the performance of GaAs-based MESFET devices realized using AlGaAs etch stop layers of the requisite thickness has tended to degrade due to the resultant increased source access resistance.

OBJECTS OF THE INVENTION

Accordingly, it is an object of the present invention to provide a method for fabricating semiconductor devices which employs an etching technique having a high etch selectivity and a low potential for inducing device damage.

It is a further object of the present invention to provide an etching technique capable of increasing the uniformity of semiconductor device operating characteristics, such as FET saturated current ($I_{dss}$), without compromising device performance.

SUMMARY OF THE INVENTION

In summary, it has been discovered that a buffered aqueous solution comprising citric acid [$HOC(CH_2COOH)_2COOH \cdot H_2O$], a salt of citric acid such as potassium citrate [$HOC(CH_2COOK)_2COOK \cdot H_2O$], and hydrogen peroxide [$H_2O_2$], in a proper pH range, selectively etches GaAs-containing Group III–V compounds in the presence of other Group III–V compounds. As an illustration, $Al_yGa_{1-y}As$ is selectively etched in the presence of $Al_xGa_{1-x}As$ ($0 \leqq y < 0.2$ & $x > 0.2$) when the pH range of the etchant solution is between approximately 3 and 6.

It has further been discovered that an $Al_xGa_{1-x}As$ etch stop layer of a thickness less than a critical value determined by x does not degrade the source access resistance of GaAs-based MESFET devices. The critical layer thicknesses corresponding to x=0.35, 0.50, and 1.00 are approximately 40 angstroms, 25 angstroms, and 10 angstroms, respectively.

The etchant solution described herein may be utilized to improve the uniformity of devices in the fabrication of, for example, high-frequency transistors. Such devices exhibit improved saturated current ($I_{dss}$) and threshold voltage ($V_{th}$) uniformity.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Although the compound semiconductor material referred to herein is composed of gallium arsenide (GaAs) and aluminum gallium arsenide (AlGaAs), the etchant of the present invention may be suitable for application to structures comprised of other semiconductor compounds. In what follows the concentration (i.e. mole fraction) of aluminum in $Al_xGa_{1-x}As$ will be identified as x, where x can range from 0 to 1. The examples below describe in detail the use of a buffered aqueous solution comprising citric acid [$HOC(CH_2COOH)_2COOH.H_2O$], a salt of citric acid such as potassium citrate [$HOC(CH_2COOK)_2COOK.H_2O$], and hydrogen peroxide [$H_2O_2$], in a proper pH range, as a selective etch for $Al_yGa_{1-y}As$ in the presence of $Al_xGa_{1-x}As$ ($0 \leqq y < 0.2$ & $x > 0.2$). In addition, data are included illustrating that the etch selectivity ratio varies as a function of aluminum mole fraction. Unless indicated otherwise, the various materials, dimensions, and the like specified herein are illustrative only and are not to be construed as limiting the scope of the invention.

Figure 1:
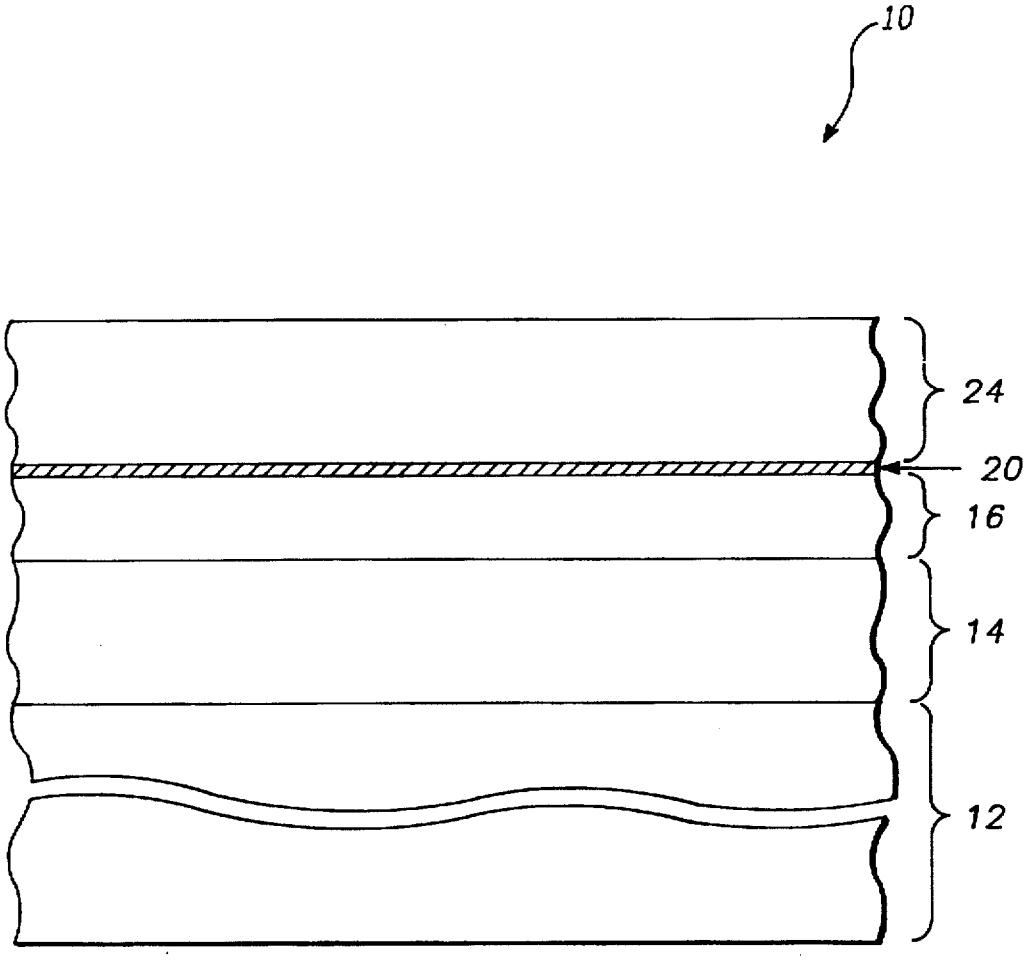
FIG. 1 shows a cross-sectional view (not to scale) of a semiconductor wafer which may be further processed to yield GaAs-based field-effect transistors.

FIG. 1 shows a cross-sectional view (not to scale) of a semiconductor wafer 10 which may be further processed to yield, for example, GaAs-based field-effect transistors. The wafer 10 includes a GaAs semi-insulating substrate 12 on which were grown an undoped GaAs buffer layer 14 and a doped GaAs channel layer 16 using molecular beam epitaxy (MBE) techniques. A thin $Al_xGa_{1-x}As$ ($0.25 \leqq x \leqq 1.0$) etch stop layer 20 and doped GaAs contact layer 24 were then also epitaxially grown through an MBE process upon the channel layer 16. Wafers were processed in which the thickness of the AlGaAs etch stop layer 20 ranged, in accordance with increasing mole fraction x, from approximately 50 to 8 angstroms (Å). The thicknesses of the channel layer 16 and contact layer 24 were chosen to be approximately 650 Å and 1000 Å, respectively.

Figure 2:
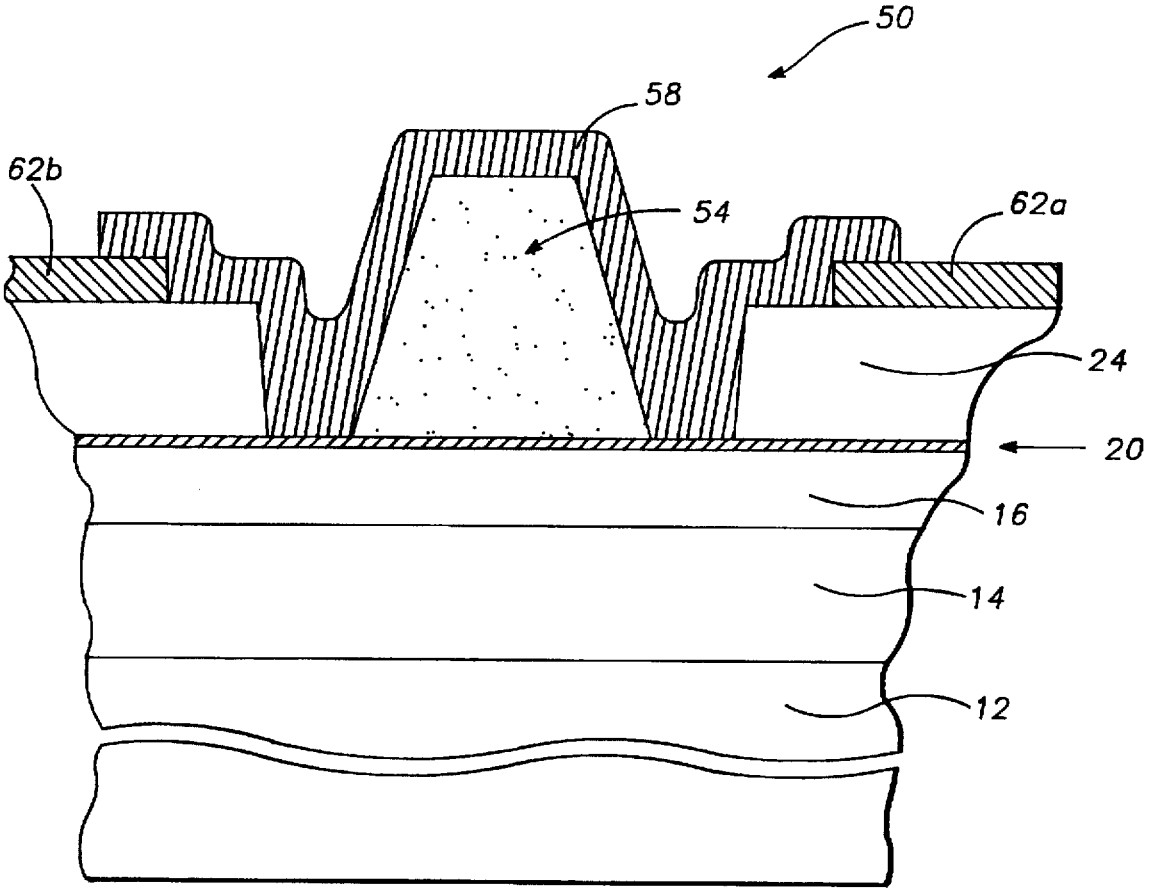
FIG. 2 is a cross-sectional view of a field-effect transistor (FET) structure formed by selectively etching the wafer of FIG. 1 in accordance with the invention.

FIG. 2 provides a cross-sectional view of a GaAs MESFET processed in accordance with the present invention. Subsequent to conventional device isolation and ohmic contact formation, the wafer 10 was patterned for gate definition in a conventional manner. The wafer 10 was then selectively etched as an intermediate step in forming the field-effect transistor (FET) structure 50 shown in cross-section in FIG. 2. Etch selectivity was controlled primarily by adjusting the pH of the etching solution, the concentration of $H_2O_2$, and the sum of the concentrations of citric acid and potassium citrate. A gate region 54 and passivation layer 58 were then conventionally formed upon the portion of the etch stop layer 20 exposed during the etching process. The FET structure 50 further includes ohmic contacts 62a and 62b deposited over drain and source regions of the contact layer 24. Current flow between the drain and source contacts 62a and 62b is controlled by adjusting the voltage applied to the gate region 54, thereby modulating the conductivity of the channel region 16.

Figure 3:
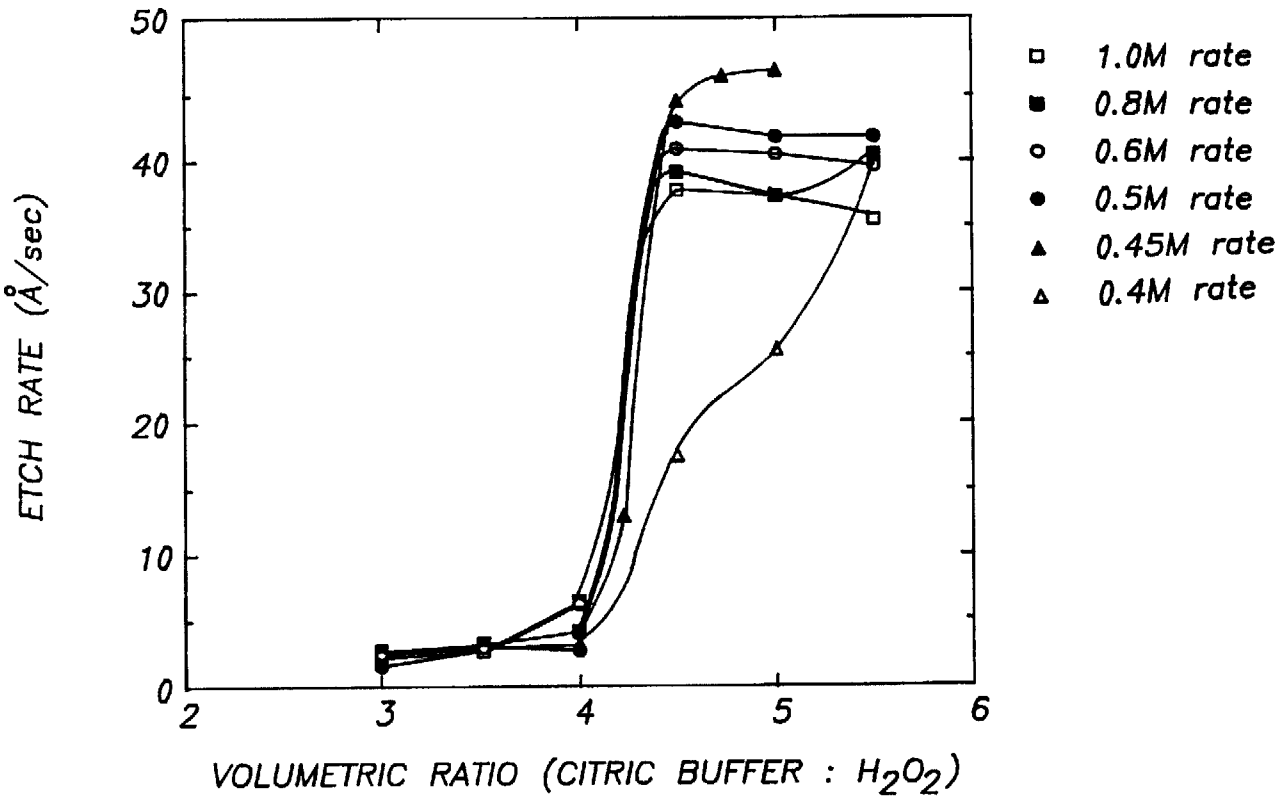
FIG. 3 illustrates the rate (Å/sec) at which GaAs is etched by an etchant solution formulated in accordance with the present invention, and specifically shows etch rate as a function of the ratio of the volume of a citrate buffer composed of citric acid and potassium citrate, to the volume of $H_2O_2$ in the etchant solution.

FIG. 3 illustrates the etch rate (Å/sec) of GaAs as a function of the ratio of the volume of citrate buffer, i.e., citric acid and potassium citrate, to the volume of 30% $H_2O_2$ (hereinafter referred to simply as $H_2O_2$) within an etchant solution formulated in accordance with the present invention. FIG. 3 relates to experimental etching conducted at citrate buffer concentrations of 0.4 moles/liter(M), 0.45M, 0.5M, 0.6M, 0.8M and 1.0M. As is indicated by FIG. 3, relatively higher etch rates are observed for volumetric ratios of buffer to $H_2O_2$ greater than four. The highest etch rates are observed at buffer concentrations of between 0.45M and 0.6M.

*The buffered etchant solution has a concentration in moles/liter of hydrogen peroxide in said solution which is greater than the concentration in moles/liter of citric acid in the solution and greater than the concentration in moles/liter of the salt of citric acid in the solution. The concentration of hydrogen peroxide is in the range of approximately 1–2.5 moles/liter when the concentration of citric acid is in the range of approximately 0.2–0.7 moles/liter and the concentration of the salt of citric acid is approximately in the range of 0.2–0.7 moles/liter.*

Figure 4:
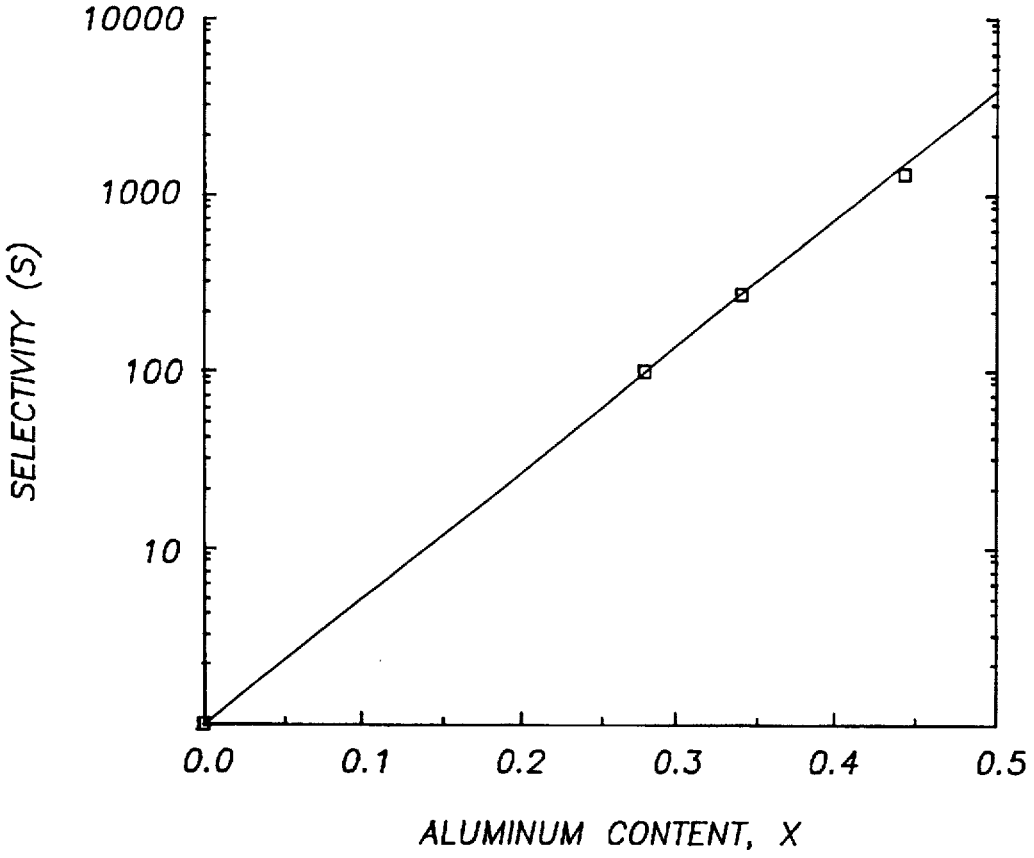
FIG. 4 shows the etch selectivity of GaAs relative to $Al_xGa_{1-x}As$ as a function of aluminum content (x), where etching was performed using an etchant solution of the present invention.

FIG. 4 shows the etch selectivity of GaAs relative to $Al_xGa_{1-x}As$ as a function of aluminum mole fraction (x), where etching was performed using an etchant solution of the present invention. Etch selectivity, defined as the ratio of the GaAs etch rate to the $Al_xGa_{1-x}As$ etch rate, is seen to increase exponentially with aluminum content for the measured set of AlGaAs compounds, which includes compounds containing up to 45% aluminum. Etch rates for each material were determined using a citrate buffer concentration of 0.3M mixed in a volumetric ratio of 8:1 with $H_2O_2$.

Figure 5:
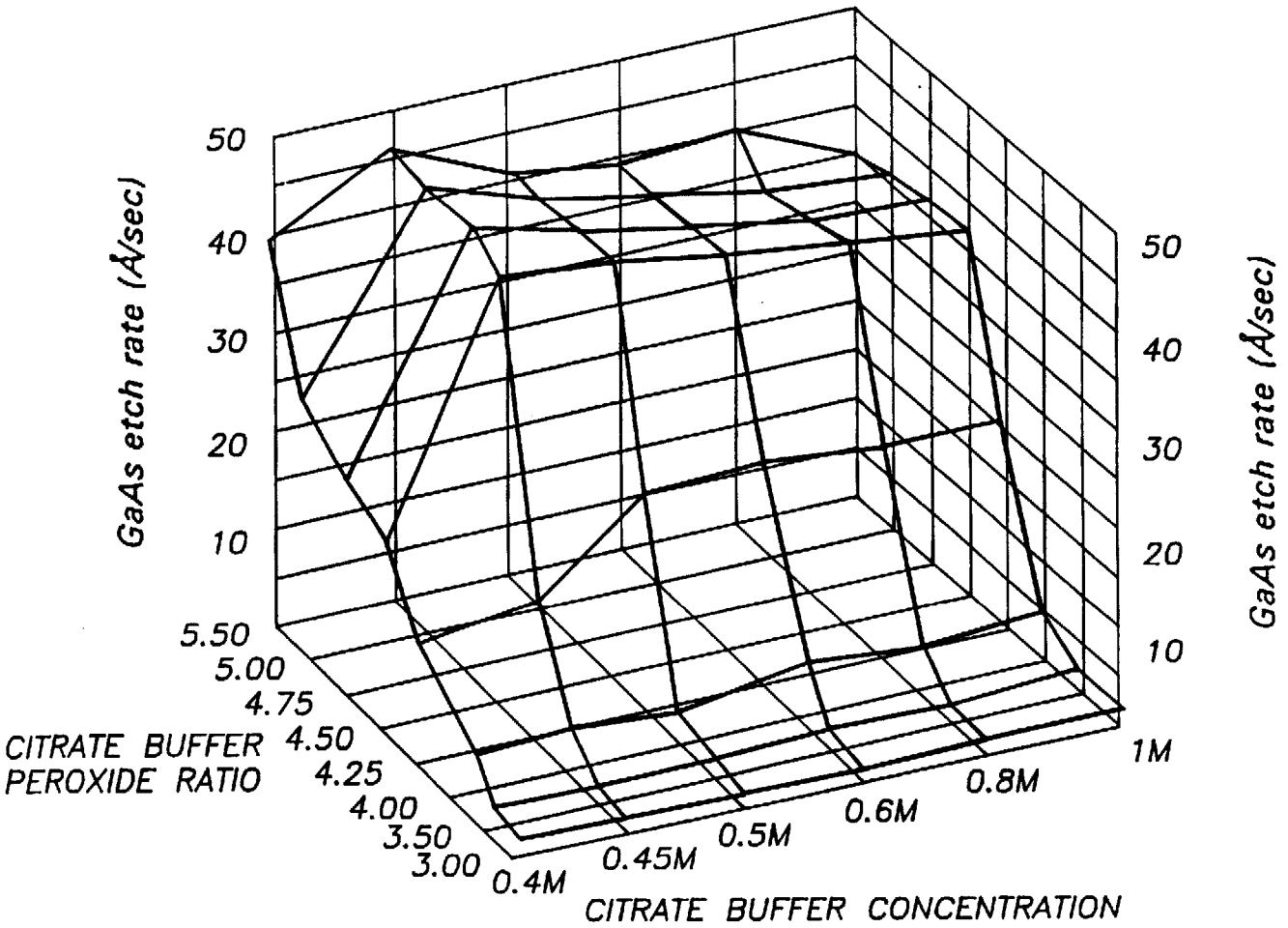
FIG. 5 is a three-dimensional graphical representation of the etch rate of GaAs as a function of selected values of citrate buffer concentration, and as a function of the volumetric ratio of citrate buffer to $H_2O_2$.

FIG. 5 provides a three-dimensional graphical representation of the etch rate of GaAs as a function of selected values of citrate buffer concentration, and as a function of the volumetric ratio of citrate buffer to $H_2O_2$. As shown in FIG. 5, etch rate increases monotonically as the buffer to $H_2O_2$ ratio increases up to a ratio of about 5:1, with a significant increase in etch rate occurring between the ratios of 4.0 and 4.5. Buffer concentration is shown to have a similar effect, in that, for concentration values below 0.45 moles/liter GaAs etch rate is seen to significantly decrease.

Figure 6:
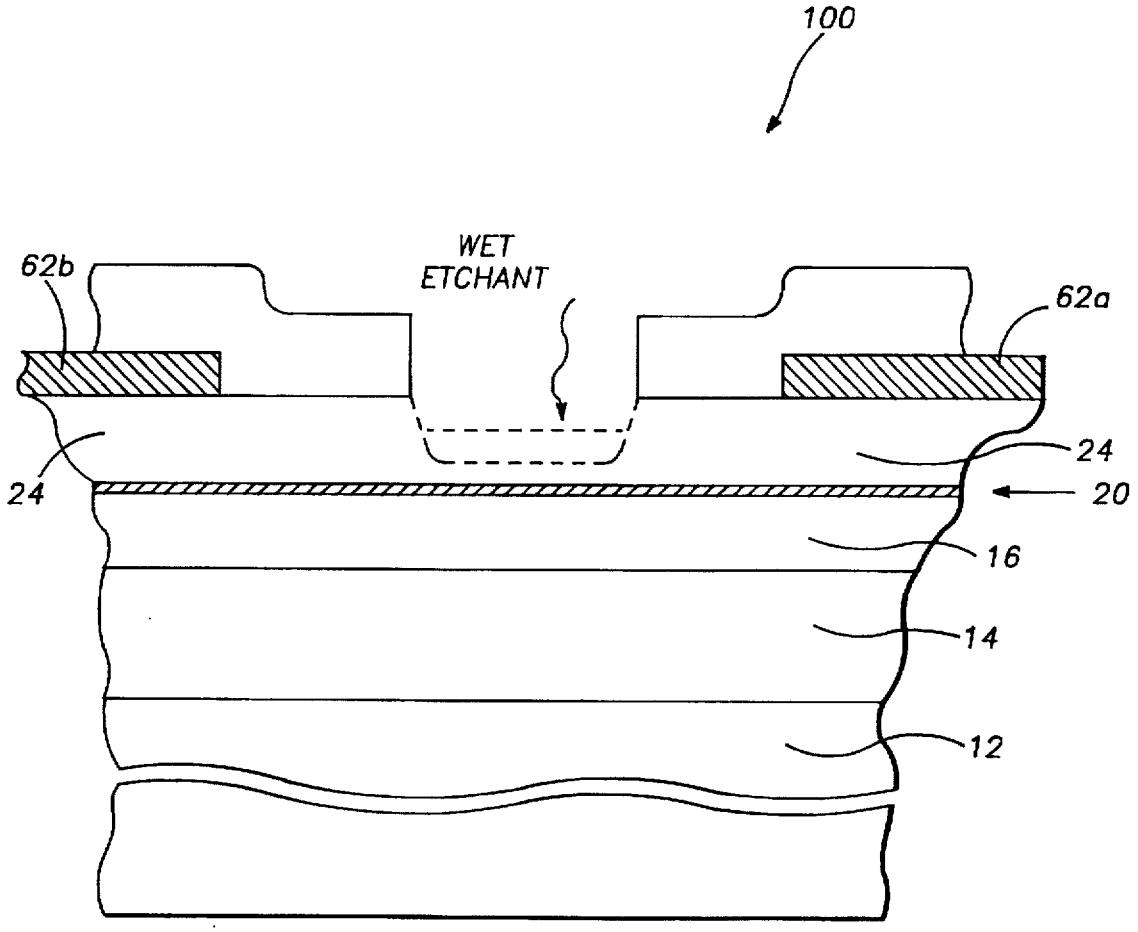
FIG. 6 depicts a cross-sectional view of a semiconductor structure undergoing etching in accordance with the present invention.

FIG. 6 depicts a semiconductor structure 100 grown in a manner substantially identical to that described above with reference to the wafer 10 (FIG. 1). The semiconductor structure 100 includes ohmic contacts 62a and 62b deposited upon the GaAs contact layer 24 using conventional techniques. A recessed gate field effect transistor such as the FET 50 (FIG. 2) may be formed from the structure 100 by etching the GaAs contact layer 24 through a mask between the contacts 62a and 62b to a depth determined by the position of the etch stop layer 20. The low rate at which the stop layer 20 is etched relative to the layer 24 advantageously allows etching to be performed without precise control of etching time. That is, the barrier formed by the stop layer 20 prevents the active channel region formed by the GaAs layer 16 from being etched when the structure 100 is subjected to an etchant formulated in accordance with the invention for a period longer than that required to completely etch the layer 24. This enables the current characteristics of the device to be determined by the epitaxial structure and substantially independent of etching time. In contrast, conventional etching in the absence of stop layer 24 requires that the current flowing between the contacts 62a and 62b in response to a voltage applied therebetween be monitored in order to determine when the active channel region is of the desired thickness. This repeated monitoring reduces production efficiency by requiring multiple etch steps, rather than the single etching step contemplated by the invention, to achieve the desired channel thickness.

Figure 7:
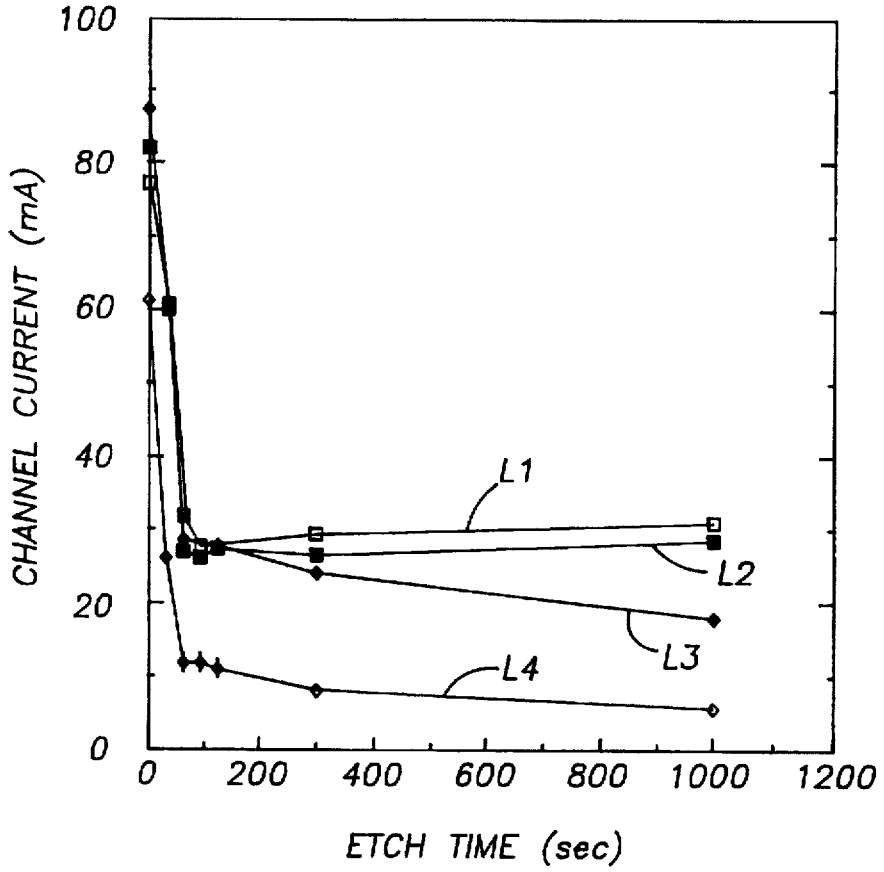
FIG. 7 is a graphical representation of the current flowing between a pair of ohmic contacts deposited on the surface of the structure of FIG. 6 as a function of etch time.

This advantage may be more fully appreciated with reference to FIG. 7, which is a graphical representation of the current flowing between the contacts 62a and 62b as function of the time selective etching was performed in accordance with the invention. Experiments were performed using four etch stop layers (L1, L2, L3, and L4), having thicknesses of 25 Å, 14 Å, 25 Å, and 8 Å and aluminum mole fractions (x) of 0.35, 0.35, 0.25 and 1.0, respectively. As is indicated by FIG. 7, the current between the contacts 62a and 62b dropped significantly in all instances during the initial 50 seconds of etching as the thickness of the layer 24 was reduced between the contacts 62a and 62b. The subsequent insignificant change in etch current shows that each of the etch stop layers L1–L4 are capable of preventing the underlying active channel region 16 from being etched significantly for at least 1000 seconds. Accordingly, the present invention obviates the need to monitor the current between the contacts 62a and 62b as a means of providing an active channel of desired thickness.

Figure 8:
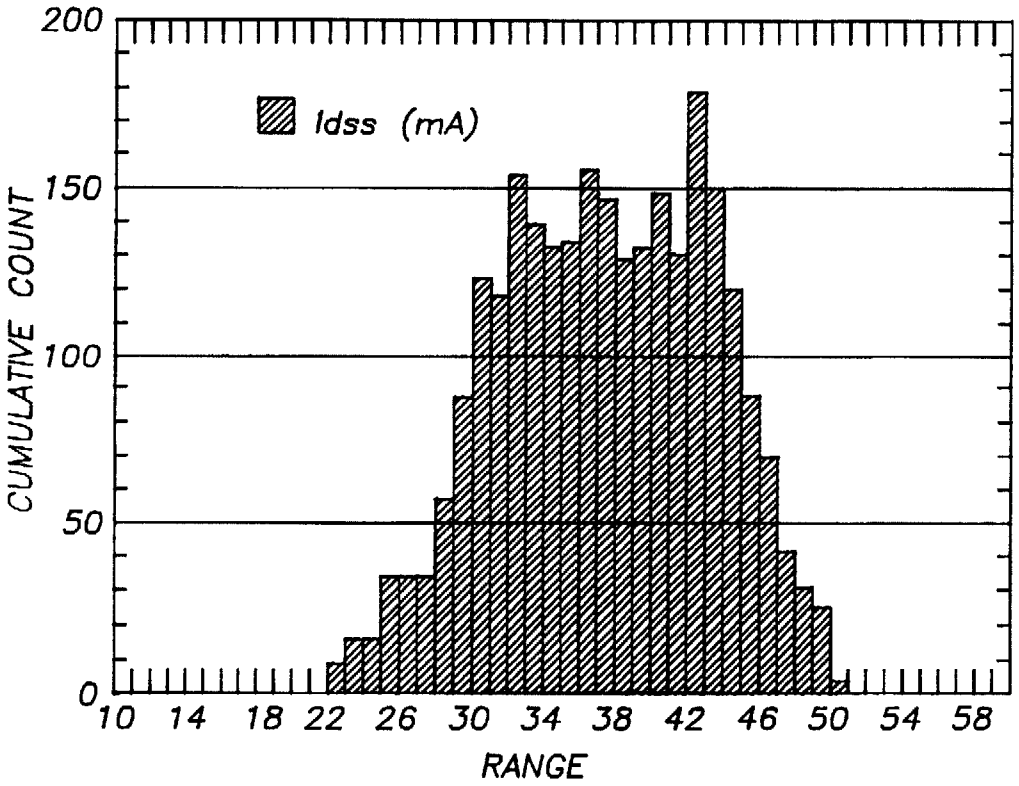
(PRIOR ART) FIG.—8
FIG. 8 shows a distribution of saturated drain to source current ($I_{dss}$) for a set of GaAs field-effect transistors realized on a wafer using a conventional wet etchant.

FIG. 8 shows a distribution of saturated drain to source current ($I_{dss}$) for a set of field-effect transistors realized on a wafer using a conventional wet etchant consisting of water, phosphoric acid, and $H_2O_2$. The height of each rectangular bar in FIG. 8 is the cumulative number of transistors on the wafer having a particular $I_{dss}$ at an applied drain to source voltage, $V_{ds}$, of 2.0 volts. The number of transistors having $I_{dss}$ within a predefined range of the median $I_{dss}$ is one factor bearing on wafer yield, i.e., the percentage of transistors on the wafer having acceptable operating characteristics. In this regard the median $I_{dss}$ of the distribution of FIG. 8 is 37.6 mA, with the upper and lower quartiles of $I_{dss}$ values being above 42.3 mA and below 32.9 mA, respectively. One parameter used to evaluate acceptable $I_{dss}$ variation is the percentage of median $I_{dss}$ corresponding to the current spread between the upper and lower quartiles. This percentage, hereinafter denoted as $\%\Delta Q$, is equivalent to 25% for the $I_{dss}$ distribution of FIG. 8.

Figure 9:
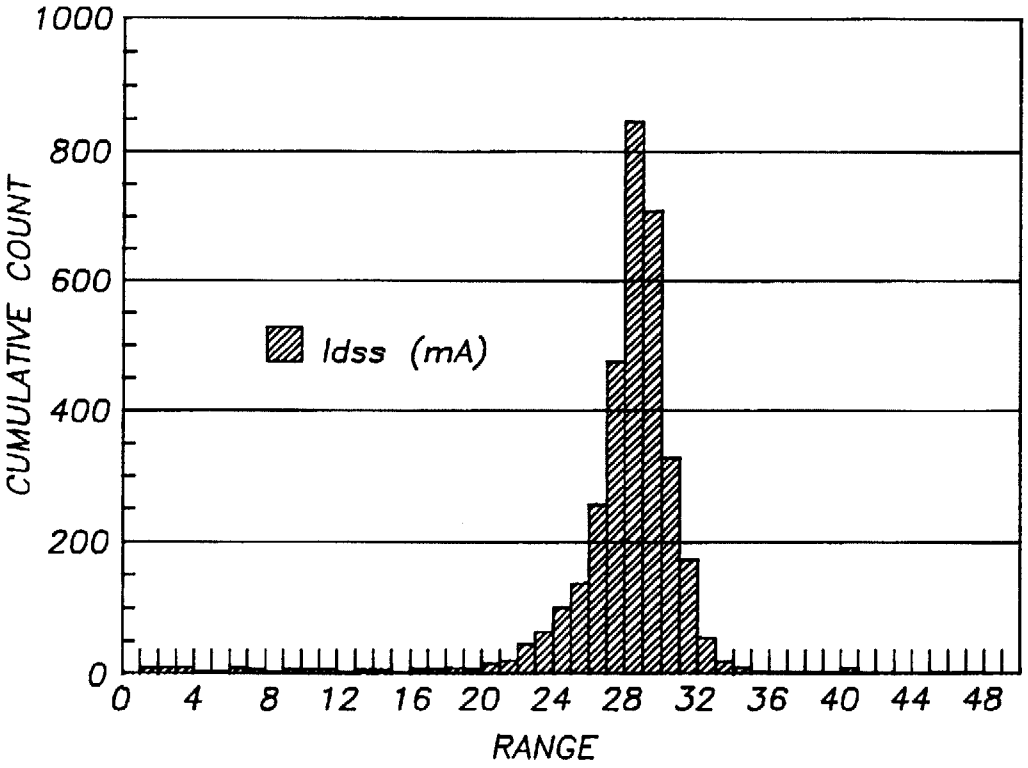
FIG. 9 shows the $I_{dss}$ current distribution for the transistors on a wafer etched in accordance with the buffered etch solution of the invention.

FIG. 9 shows the $I_{dss}$ current distribution for the transistors on a wafer etched in accordance with the invention. Specifically, etching was effected using a buffered etch consisting of a solution 0.4M in citric acid and 0.4M in potassium citrate mixed in a volumetric ratio of 6:1 with $H_2O_2$. From FIG. 9 it can be seen that the variation in $I_{dss}$ among the set of transistors realized using the inventive etching technique is significantly less than the $I_{dss}$ variation associated with the distribution of FIG. 8. The $\%\Delta Q$ of 8% characterizing the distribution of FIG. 9 is typical of the improved uniformity in $I_{dss}$ made possible by the present invention.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of making a semiconductor device comprising the steps of:

fabricating a structure having first and second Group III–V compound regions of differing composition, said first compound region including GaAs;

subjecting said structure to an etchant comprising a solution of a citrate buffer and $H_2O_2$ with a pH in the range of approximately 3 to 6 so that said first region is selectively etched with respect to the second region, said citrate buffer including citric acid and a salt of citric acid, wherein the concentration [by volume] *in moles/liter* of hydrogen peroxide in said solution is greater than the concentration [by volume] *in moles/liter* of citric acid in said solution and greater than the concentration [by volume] *in moles/liter* of said salt of citric acid in said solution.

2. The method of claim 1 further including the step of formulating said etchant such that said concentration of $H_2O_2$ is in the range of approximately 1–2.5 moles/liter when said concentration of citric acid is in the range of approximately 0.2–0.7 moles/liter.

3. The method of claim 2 further including the step of formulating said etchant such that said concentration of $H_2O_2$ is in the range of approximately 1–2.5 moles/liter when said concentration of said salt of citric acid is approximately in the range 0.2–0.7 moles/liter.

4. The method of claim 1 further including the step of formulating said etchant such that:

said concentration of said salt of citric acid in said solution is in the range of 0.2–0.7 moles/liter, and one-half of the sum of said concentrations of said citric acid and said salt of citric acid is greater than 0.3 moles/liter and less than 1.0 moles/liter.

5. The method of claim 1 wherein said first compound region consists of $Al_yGa_{1-y}As$ and said second compound region consists of $Al_xGa_{1-x}As$ wherein ($0 \leqq y < 0.2$) and ($0.2 < x \leqq 1.0$).

6. A method of making a semiconductor device comprising the steps of:

fabricating a structure by (i) growing one or more layers of the type $X_aY_{1-a}As$, where X is an atom selected from the group of IIIA atoms and Y is a different atom selected from the group of IIIA atoms, and where ($0 < a \leqq 1$) upon a semiconductor substrate, and (ii) growing first and second Group III–V compound regions of differing composition upon said one or more layers, said first compound region including GaAs; and subjecting said structure to an etchant comprising a solution of a citrate buffer and $H_2O_2$ with a pH in the range of approximately 3 to 6 so that said first region is selectively etched, said citrate buffer including citric acid and a salt of citric acid, wherein the concentration in *moles/liter* of hydrogen peroxide in said solution is greater than the concentration *in moles/liter* of citric acid in said solution and greater than the concentration *in moles/liter* of said salt of citric acid in said solution.

7. The method of claim 6 wherein said second region comprises $Al_xGa_{1-x}As$ where ($0.2 < x \leqq 1$), said second region being grown upon said one or more layers to a thickness selected in accordance with the value of x.

8. A method of making a field-effect transistor comprising the steps of:

fabricating a structure by (i) growing one or more active channel layers comprised of Group III–V compounds upon a semiconductor substrate, (ii) growing a thin etch stop region of $Al_xGa_{1-x}As$ upon said active channel layers where ($0.2 < x \leqq 1$), and (iii) growing a cap region including GaAs upon said thin etch stop region; and subjecting said structure to an etchant comprising a solution of a citrate buffer and $H_2O_2$ with a pH in the range of approximately 3 to 6 so that said cap region is selectively etched and said etch stop region prevents etching of said active channel layers, said citrate buffer including citric acid and a salt of citric acid, wherein the concentration *in moles/liter* of hydrogen peroxide in said solution is greater than the concentration *in moles/liter* of citric acid in said solution and greater than the concentration *in moles/liter* of said salt of citric acid in said solution.

9. The method of claim 1 wherein said salt of citric acid comprises potassium citrate.

10. The method of claim 6 wherein said salt of citric acid comprises potassium citrate.

11. A method of making a semiconductor transistor device comprising the steps of:

fabricating a structure having first and second active channel layers respectively comprised of first and second Group III–V compound regions of differing composition, said first compound region including GaAs and said second compound region being of a thickness of less than 100 angstroms;

subjecting said structure to an etchant comprising a solution of a citrate buffer and $H_2O_2$ with a pH in the range of approximately 3 to 6 so that said first region is selectively etched with respect to the second region, said citrate buffer including citric acid and a salt of citric acid, wherein the concentration [by volume] *in moles/liter* of hydrogen peroxide in said solution is greater than the concentration [by volume] *in moles/liter* of citric acid in said solution and greater than the concentration [by volume] *in moles/liter* of said salt of citric acid in said solution.

* * * * *